US006200891B1

(12) United States Patent
Jagannathan et al.

(10) Patent No.: US 6,200,891 B1
(45) Date of Patent: Mar. 13, 2001

(54) REMOVAL OF DIELECTRIC OXIDES

(75) Inventors: Rangarajan Jagannathan, Essex Junction, VT (US); Karen P. Madden, Poughquag, NY (US); Kenneth J. McCullough, Fishkill; Harald F. Okorn-Schmidt, Putnam Valley, both of NY (US); Keith R. Pope, Danbury, CT (US); David L. Rath, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/133,537

(22) Filed: Aug. 13, 1998

(51) Int. Cl.$^7$ ...................... H01L 21/4763; H01L 21/302
(52) U.S. Cl. .................... 438/622; 438/625; 438/637; 438/743
(58) Field of Search ..................... 438/724, 744, 438/723, 743, 740, 586, 622, 625, 637, 627

(56) References Cited

U.S. PATENT DOCUMENTS

| | | | |
|---|---|---|---|
| 3,676,240 | 7/1972 | Retajczyk | 156/17 |
| 3,935,117 | 1/1976 | Suzuki et al. | 252/79.1 |
| 3,979,241 | 9/1976 | Maeda et al. | 156/13 |
| 4,230,523 | 10/1980 | Gagda | 156/657 |
| 4,267,013 | 5/1981 | Iida et al. | 156/643 |
| 4,269,654 | 5/1981 | Deckert et al. | 156/657 |
| 4,285,763 | 8/1981 | Coldren | 156/643 |
| 4,325,984 | 4/1982 | Galfo et al. | 427/38 |
| 4,334,343 | 6/1982 | Aoyama et al. | 29/579 |
| 4,351,696 | 9/1982 | Radigan | 156/643 |
| 4,395,304 | 7/1983 | Kern et al. | 156/657 |
| 4,444,618 | 4/1984 | Saia et al. | 156/643 |
| 4,472,237 | 9/1984 | Deslauriers et al. | 156/643 |
| 4,547,260 | 10/1985 | Takada et al. | 156/643 |
| 4,692,205 | 9/1987 | Sachdev et al. | 156/643 |
| 4,899,767 | 2/1990 | McConnell et al. | 134/56 R |
| 4,952,035 * | 8/1990 | Yuasa et al. | 350/354 |
| 4,962,049 | 10/1990 | Chang et al. | 437/13 |
| 4,971,715 | 11/1990 | Armant et al. | 252/143 |
| 4,985,113 | 1/1991 | Fujimoto et al. | 156/643 |
| 4,985,990 | 1/1991 | Cronin et al. | 29/852 |
| 4,987,101 | 1/1991 | Kaanta et al. | 437/228 |
| 5,012,692 | 5/1991 | Nagano | 74/475 |
| 5,019,479 * | 5/1991 | Oka et al. | 430/172 |
| 5,037,506 | 8/1991 | Gupta et al. | 156/646 |
| 5,082,518 | 1/1992 | Molinaro | 156/345 |
| 5,139,624 | 8/1992 | Searson et al. | 204/129.3 |
| 5,217,570 | 6/1993 | Kadomura | 156/665 |
| 5,308,440 | 5/1994 | Chino et al. | 156/664 |
| 5,334,332 | 8/1994 | Lee | 252/548 |
| 5,338,416 | 8/1994 | Mlcak et al. | 204/129.3 |
| 5,348,619 | 9/1994 | Bohannon et al. | 156/664 |
| 5,348,627 | 9/1994 | Propst et al. | 204/129.3 |
| 5,350,488 | 9/1994 | Webb | 156/643 |
| 5,387,361 | 2/1995 | Kohara et al. | 252/79.1 |
| 5,407,860 | 4/1995 | Stoltz et al. | 437/180 |
| 5,419,779 | 5/1995 | Ward | 134/38 |
| 5,431,766 | 7/1995 | Propst et al. | 156/345 |
| 5,461,003 | 10/1995 | Havemann et al. | 437/187 |
| 5,468,342 | 11/1995 | Nulty et al. | 156/643.1 |
| 5,475,267 | 12/1995 | Ishii et al. | 257/752 |
| 5,478,436 * | 12/1995 | Winebarger et al. | 156/636.1 |
| 5,533,635 | 7/1996 | Man | 216/67 |
| 5,544,776 | 8/1996 | Okuda et al. | 216/83 |
| 5,556,482 | 9/1996 | Ward et al. | 134/38 |
| 5,571,447 | 11/1996 | Ward et al. | 510/206 |
| 5,591,299 | 1/1997 | Seaton et al. | 156/626.1 |
| 5,650,041 | 7/1997 | Gotoh et al. | 156/653.1 |
| 5,698,503 | 12/1997 | Ward et al. | 510/176 |
| 5,709,756 | 1/1998 | Ward et al. | 134/1.3 |
| 5,753,418 * | 5/1998 | Tsai et al. | 438/713 |
| 5,756,402 | 5/1998 | Jimbo et al. | 438/724 |
| 5,780,363 | 7/1998 | Delehanty et al. | 438/748 |
| 5,824,601 | 10/1998 | Dao et al. | 438/713 |
| 6,013,574 * | 1/2000 | Hause et al. | 438/622 |
| 6,020,104 * | 2/2000 | Hosaka et al. | 430/191 |

FOREIGN PATENT DOCUMENTS

| | | |
|---|---|---|
| 238622 | 8/1986 | (DE) . |
| 56-161677 | 12/1981 | (JP) . |
| 58-110078 | 6/1983 | (JP) . |
| 58-143532 | 8/1983 | (JP) . |
| 58-204450 A2 | 11/1983 | (JP) . |

OTHER PUBLICATIONS

El–Kareh, B., *Fundamentals of Semiconductor Processing Technologies*, Kluwer Academic Publishers, Norwell, MA, 1995: 565–571, Month Unknown.

Anon, Flush Fluids for Ink Jet Ink Devices, *Research Disclosure*, Jan. 1991, No. 321.

"Etching $SiO_2$ Films in Aqueous 0.49% HF", Somashekhar et al, *Electrochem. Soc.*, vol. 143, No. 9, pp. 2885–2891, Sep. 1996.

* cited by examiner

Primary Examiner—Amir Zarabian
Assistant Examiner—Michael S. Lebentritt
(74) Attorney, Agent, or Firm—Pollock, Vande Sande & Amernick; Steven Capella

(57) ABSTRACT

Oxides such as those commonly used in interlevel dielectrics may be removed employing a liquid composition containing a fluoride-containing compound and an organic solvent. Preferred compositions are substantially nonaqueous and include an anhydride. Improved methods for selective removal of oxides, especially for removal of silicon oxides where pre-exposed (or conductive metal - containing) features are present, where metal (conductive metal - contaimg) features are to be exposed by the desired oxide removal, or where the silcon oxide otherwise contacts metal (or conductive metal - containing) features are provided.

29 Claims, No Drawings

REMOVAL OF DIELECTRIC OXIDES

TECHNICAL FIELD

The present invention is concerned with removing silicon oxide from a substrate and particularly selectively removing interlevel dielectric such as silicon oxide without attacking metal also exposed to the composition used for removing the silicon oxide.

BACKGROUND

In the fabrication of microelectronic components, a number of the steps involved, for instance, in preparing integrated circuit chips and the packaging for the chips (articles to which the chips are attached for electrical interfacing and/or protection), are etching processes. Accordingly, over the years, a number of vastly different types of etching processes to remove material, sometimes in selective areas, have been developed and are utilized to varying degrees. Moreover, the steps of etching different layers which constitute, for instance, the finished integrated circuit chip are among the most critical and crucial steps.

Silicon oxide layers such as those formed by reacting tetraethylorthosilicate (TEOS) and oxygen or ozone have been used as insulators especially where gap-filling considerations (i.e. filling gaps between pre-existing structures) are important. Such silicon oxide layers are often used in so-called interlevel dielectric (ILD) between metal interconnects of aluminum/copper or tungsten typically for back end of the line (BEOL) wiring. A general discussion of interlevel dielectrics can be found in "Fundamentals of Semiconductor Processing Technology" by ElKareh, Kluwer Academic Publishers, (1995), pages 565–571, which discussion is incorporated herein by reference. Moreover, silicon oxide layers and other insulators obtained by other processes may likewise be used as interlevel dielectrics. For example, other widely used materials for such purposes are boron and/or phosphorous doped silicate glasses.

In a formation of a conventional ILD oxide structure, a first layer of interlevel dielectric such as silicon oxide may be deposited on a surface having raised metal features (e.g., metal lines) by chemical vapor deposition (CVD) with the silicon oxide filling the gaps between the metal lines. This CVD step typically results in the formation of undesired voids between in the deposited oxide between the metal features. The silicon oxide over the horizontal (top) surfaces of the metal lines may then be removed by an anisotropic etch (e.g., sputter etching) to open the voids. The structure at this point typically has silicon oxide left in spaces between lines and as spacers on the sidewalls of the metal lines. A second layer of an insulator such as silicon oxide can then be deposited to fill the voids and complete the interlevel dielectric structure between different metallic layers.

In some instances, it may be desirable to replace certain components of an interlevel dielectric structure with alternative dielectric materials to modify the dielectric function of the ILD (e.g., by substituting a lower dielectric constant material) and/or to facilitate some other processing step or device construction. For example, the removal of oxide dielectric might be desired in order to form air bridge, air gap or other very low dielectric constant configurations. See for example, the formation of structures discussed in U.S. Pat. Nos. 4,985,990; 4,987,101; 5,308,440; 5,407,860; and 5,461,003, the disclosures of which are incorporated herein by reference.

The ability to economically and reliably form these various dielectric structures often depends on the ability to selectively remove silicon oxides especially where pre-exposed metal features are present or where metal features are to be exposed by the desired oxide removal. Thus, it is desired to obtain improved oxide removal processes which have improved performance capability and reliability. In addition to improving the manufacture of existing device structures, such improved processes would enable the commercial manufacture of structures which may not be practical using known techniques. The need for improved oxide removal processes increases with reduction in size of the metal features in the integrated circuit design.

SUMMARY OF INVENTION

The invention provides improved methods for selective removal of oxides, especially for removal of silicon oxides where pre-exposed metal (or conductive metal-containing) features are present, where metal (or conductive metal-containing) features are to be exposed by the desired oxide removal, or where the silicon oxide otherwise contacts metal (or conductive metal-containing) features. The methods of the present invention are especially useful for removing interlevel dielectric (ILD) oxides, also referred to as BEOL insulator.

In one aspect, the invention encompasses processes for the removal of dielectric oxides wherein the processes comprise contacting an article that contains metal (or conductive metal-containing) features and exposed dielectric oxide with a liquid composition that preferably contains about 0.5 to about 15.0 molar of a fluoride-containing compound and an organic solvent to thereby selectively remove the dielectric oxide.

The organic solvents employed in the present invention preferably have relatively high flash point and provide low viscosity compositions. The more preferred solvents are propylene carbonate, N-methylpyrrolidone and gamma butyrolactone, ethylene glycol and propylene glycol with propylene carbonate being the most preferred. HF is a preferred fluoride-containing compound.

The processes of the invention are especially useful for removing oxides commonly used in the construction of interlevel dielectric structures.

Other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The invention provides improved methods for selective removal of oxides, especially for removal of silicon oxides where pre-exposed metal (or conductive metal-containing) features are present, where metal (or conductive metal-containing) features are to be exposed by the desired oxide removal, or where the silicon oxide otherwise contacts metal (or conductive metal-containing) features (e.g., if partial oxide removal over a covered metal feature is desired).

The methods of invention are especially useful for selectively removing interlevel dielectric oxides without substantial etching of metal or conductive metal-containing features. The dielectric oxide is preferably a silicon oxide (e.g., $SiO_2$) and/or a silicate containing one or more elements selected from groups 3A (e.g. boron) and 5A (e.g. phosphorus or arsenic). The interlevel dielectric may be adjacent to a metal or metal-containing features formed from various materials such as copper, copper alloy, titanium, titanium nitride, tantalum, tantalum nitride, aluminum and/or aluminum alloy. The methods of the invention may involve contacting both the dielectric oxide and the metal or metal-containing features with the etching composition.

The liquid compositions employed pursuant to the present invention are preferably essentially non-aqueous and contain a fluoride-containing compound and an organic solvent. The amount of the fluoride-containing compound in the composition is preferably about 0.5 to about 15 molar, more preferably about 2 to about 10 molar, most preferably about 5 to about 7 molar. The molarities indicated above are based on the total volume of the liquid composition.

The fluoride-containing compound may be any compound capable of providing fluorine ion activity for removal of the oxide. Preferably, the fluoride-containing compound is chosen to avoid adverse effects with the underlying substrate or other components of the liquid composition. Examples of suitable fluoride-containing compounds for use in the present invention are hydrofluoric acid, ammonium fluoride, fluoroborates, fluoroboric acid, tin bifluoride, antimony fluoride, tetrabutylammonium tetrafluoroborate, and aluminum hexafluoride. Also, fluoride salts of an aliphatic primary, secondary or tertiary alkyl amines can be used (the alkyl groups preferably being $C_1$–$C_{12}$ alkyl groups). The preferred fluoride-containing compounds are hydrogen fluoride and ammonium fluoride, with hydrogen fluoride being most preferred. If a fluoride-containing compound other than HF is used, the molarity of that compound is preferably adjusted to provide an fluorine ion activity ($F^-$ concentration) in the liquid composition equivalent to that provided by an amount of HF in the above molarity ranges.

Controlling the amount of water in the liquid compositions used in the processes of the invention is important in maintaining the superior etch selectivity of the methods of the invention. The liquid compositions used in the methods of the invention preferably contain about 20 mole % or less of water based on the moles of said fluoride-containing compound in the composition, more preferably about 3 mole % or less, most preferably, the liquid compositions of the invention contain essentially no free water.

Where the fluoride-containing compound source of choice contains a significant amount of water (e.g., a typical commercial 49 weight percent aqueous HF solution), the overall water content of the liquid composition may be controlled by addition of a dehydrating agent, by evaporation of the water or by other suitable water removal technique. The selection of a specific water removal technique may depend on the nature of the components making up the liquid composition. For example, use of a specific dehydrating agent may not be desirable if the agent would be have an adverse interaction with the fluoride component or the use of evaporation may not be efficient where a desired component already present in the liquid composition has a high volatility. Such techniques may be generally employed to reduce the water content of the liquid composition.

Examples of suitable dehydrating agents are alkyl anhydrides and aryl anhydrides. The alkyl group preferably contains 1–8 carbon atoms and the aryl group preferably contains 6–10 carbon atoms in the ring. The aryl groups can be substituted on the ring with an alkyl group containing 1–8 carbon atoms. Acetic anhydride, benzyl anhydride, and phenyl anhydride are generally preferred. As noted above, the selected dehydrating agent preferably does not adversely affect to an undesirable extent the performance characteristics of the composition. Other suitable dehydrating agents include triethylorthoformate and 2, 2' dimethoxypropane.

The amount of the anhydride used is preferably at least one anhydride group (O=COC=O) per $H_2O$ molecule, more preferably at least about a 5% excess of anhydride groups, most preferably at least about 10% excess of anhydride groups. Preferably, the excess anhydride groups will not be greater than about 25% over the one-to-one ratio mentioned above.

In the alternative, the liquid composition used in the methods of the invention can be produced by adding the fluoride-containing compound as a non-aqueous component such as by bubbling anhydrous HF gas into the desired organic solvent or by using an organic fluoride (preferably water-free). Undesired water in the organic fluoride may be removed by addition of anhydride as discussed above.

Examples of suitable organic solvent compounds for use in the invention include oxolanes, sulfolanes, esters, ketones, aldehydes, lactones, halogenated hydrocarbons, amines, imides and alcohols (including mono- and polyhydric alcohols). Examples of suitable esters are esters of carbonic acids, benzoic acid, phthalic acid, isophthalic acid and terephthalic acid, and especially the $C_1$–$C_6$ alkyl esters. Preferred organic solvents are propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, and methyl and ethyl esters of phthalic, isophthalic or terephthalic acids. The more preferred solvents employed pursuant to the present invention are propylene carbonate, N-methylpyrrolidone and gamma butyrolactone, ethylene glycol and propylene glycol with propylene carbonate being the most preferred.

Organic solvents employed in the present invention preferably enable the overall liquid composition to have a low viscosity. Low viscosity is desirable for improving overall workability of the composition as used in the processes of the invention and for providing better oxide removal uniformity. The organic solvent used in the compositions of the invention preferably have an absolute viscosity less than that of glycerol at 20° C. Thus, while glycerol can be used as the organic solvent in embodiments of the invention, it is generally not preferred.

The liquid compositions used in the methods of the invention may include other expedients, for example, tertiary amines to facilitate removal of photoresist residue that might be remaining. Typical tertiary amines may have the formula $R_1N(R_2)R_3$ wherein $R_1$, $R_2$, and $R_3$ each individually represents alkyl, aryl, alkaryl, aralkyl group or substituted derivatives thereof (e.g. derivatives containing one or more hydroxyl or anhydride groups). The alkyl groups are preferably $C_1$–$C_{12}$ alkyls while the aryl groups are preferably $C_6$–$C_{14}$ aryl groups. Typical tertiary amines are N, N, N', N'-tetramethyl ethylenediamine and triethanol amine. If used, the tertiary amine is preferably present at about 0.05 to 5 vol. %, more preferably about 1 to 3 vol. %, based on the total volume of the liquid composition. Use of tertiary amines with base-sensitive organic solvents (e.g. propylene carbonate) is preferably avoided or minimized.

The oxide removal processes of the present invention are preferably carried out at temperatures of about 20° C. to about 90° C., more preferably about 30° C. to about 70° C. Employing increased temperature generally results in increasing the removal rates of the silicon dioxide or other dielectric. The oxide removal processes of the invention generally avoid the removal of any measurable amount of metal or metal-containing features such as the conductive features typically present in or adjacent to interlevel dielectric structures. The processes of the invention are thus especially suitable for removing oxide where pre-exposed metal features are present, where metal features are desired to be exposed by oxide removal, and/or where the oxide otherwise contacts metal features (e.g., where partial removal of oxide over a covered metal feature is desired).

After etching of the silicon oxide, the resulting structure can be processed in any suitable manner for manufacture of the overall integrated circuit device. Where the method of the invention is used in conjunction with processes for forming conventional interlevel dielectric structures, any void exposed or created by the oxide removal process of the invention can be back-filled with a low dielectric constant material such as fluorinated polymer, polyimide or fluorinated glass. Where the method of the invention is used in conjunction with a process for forming air gaps or air bridges, any voids created by the oxide removal may or may not be filled depending on the specific air bridge/gap structure forming process.

The following non-limiting example is presented to further illustrate the present invention.

EXAMPLE 1

A liquid composition is prepared by admixing about 31 parts by volume of a 49 percent by weight aqueous solution of HF with about 20 parts by volume of propylene carbonate and about 10 parts by volume of acetic anhydride (99+wt. %) in an amount to provide a 6 molar solution of the anhydrous HF. A fully processed CMOS logic sample containing of silicon dioxide interlevel dielectric, aluminum metal lines, tungsten layers and titanium studs is immersed in the etching composition. The etching is carried out at a temperature of about 65° C. for about 30 minutes. The etching solution removes all of the interlevel dielectric in between the metal lines of the fully processed CMOS logic sample without any attack on the metal lines, layers and studs (i.e.—Al, W and Ti).

In this disclosure, there are shown and described only the preferred embodiments of the invention, but as aforementioned, it is to be understood that the invention is capable of use in various other combinations and environments and is capable of changes or modifications within the scope of the inventive concept as expressed herein.

What is claimed is:

1. A method for removing exposed oxide from an article wherein said article contains at least one feature selected from the group consisting of (i) a metal or conductive metal-containing structure contacting said oxide, and (ii) a metal or conductive metal-containing structure having an exposed surface, which method comprises contacting said article with a liquid composition containing about 0.5 to about 15 molar of a fluoride-containing compound and an organic solvent wherein said organic solvent is selected from the group consisting of propylene carbonate, N-methyl pyrrolidone, gamma butyrolactone, methylene chloride benzyl alcohol, N-formyl morpholine, N-formyl piperidine, cyclohexanone, cyclopentanon, methyl benzoate, diglyme, 2-methyl tetrahydrofuran, methyl and ethyl esters of acid selected from the group consisting of phthalic acid, isophthalic acid and terephthalic acid, to thereby selectively remove at least a portion of said exposed oxide.

2. The method of claim 1 wherein said exposed oxide forms part of an interlevel dielectric.

3. The method of claim 1 wherein said liquid composition contains about 20 mole % or less of water based on moles of said fluoride-containing compound.

4. The method of claim 3 wherein said liquid composition contains about 3 mole % or less of water based on moles of said fluoride-containing compound.

5. The method of claim 1 wherein said oxide is a silicon-containing oxide selected from the group consisting of silicon oxide, boron silicate, phosphorus silicate, boron phosphorus silicate or combination thereof.

6. The method of claim 1 wherein said organic solvent is selected from the group consisting of propylene carbonate, N-methyl pyrrolidone and gamma butyrolactone.

7. The method of claim 1 wherein said solvent is propylene carbonate.

8. The method of claim 1 wherein said fluoride-containing compound is selected from the group consisting of hydrofluoric acid, ammonium fluoride, fluoroborates, tetrabutylammonium tetrafluoroborate, fluoroboric acid, aluminum hexafluoride, tin bifluoride, antimony fluoride and fluoride salt of an aliphatic primary, secondary or tertiary amine.

9. The method of claim 1 wherein said fluoride containing compound is hydrofluoric acid or ammonium fluoride.

10. The method of claim 1 wherein said fluoride containing compound is hydrofluoric acid.

11. The method of claim 1 wherein an anhydride is added to said liquid composition before said contacting step.

12. The method of claim 1 wherein said liquid composition is free from water.

13. The method of claim 1 wherein said composition contains about 2 to about 10 molar of said fluoride-containing compound.

14. The method of claim 1 wherein said composition contains about 5 to about 7 molar of said fluoride-containing compound.

15. The method of claim 1 wherein the contacting with said composition is carried out at a temperature of about 20° C. to about 90° C.

16. The method of claim 1 wherein the contacting with said composition is carried out at a temperature of about 30° C. to about 70° C.

17. The method of claim 1 wherein said metal or metal-containing structure contains a material selected from the group consisting of Al, Cu, AlCu alloys, W, Ti, Ta, TaN and TiN.

18. The method of claim 1 wherein said oxide is silicon oxide.

19. The method of claim 11 wherein said anhydride is an alkyl anhydride or aryl anhydride.

20. The method of claim 11 wherein said anhydride is acetic anhydride.

21. A method for removing exposed oxide from an article wherein said article contains at least one feature selected from the group consisting of (i) a metal or conductive metal-containing structure contacting said oxide, and (ii) a metal or conductive metal-containing structure having an exposed surface, which method comprises contacting said article with a liquid composition containing about 0.5 to about 15 molar of a fluoride-containing compound and an organic solvent, and wherein said composition also contains a tertiary amine, to thereby selectively remove at least a portion of said exposed oxide.

22. The method of claim 21 wherein said tertiary amine is N,N,N',N' tetramethyl ethylenediamine.

23. The method of claim 21 wherein said organic solvent is selected from the group consisting of oxolanes, sulfolanes, esters, ketones, aldehydes, lactones, halogenated hydrocarbons, alcohols, amines and imides.

24. The method of claim 21 wherein said organic solvent is selected from the group consisting of propylene carbonate, N-methyl pyrrolidone and gamma butyrolactone.

25. The method of claim 21 wherein said solvent is propylene carbonate.

26. A method for removing exposed oxide from an article wherein said article contains at least one feature seslected from the group consisting of (i) a metal or conductive metal-containing structure contacting said oxide, and (ii) a metal or conductive metal-containing structure having an exposed surface, which method comprises contacting said article with a liquid composition containing about 0.5 to about 15 molar of a fluoride-containing compound and an organic solvent, wherein an anhydride is added to said liquid composition before said contacting step, and wherein said composition contains free water prior to the addition of said anhydride and the amount of said anhydride added provides at least 10 mole % more anhydride groups than moles of free water present prior to the anhydride addition, to thereby selectively remove at least a portion of said exposed oxide.

27. The method of claim 26 wherein said organic solvent is selected from the group consisting of oxolanes, sulfolanes, esters, ketones, aldehydes, lactones, halogenated hydrocarbons, alcohols, amines and imides.

28. The method of claim 26 wherein said organic solvent is selected from the group consisting of propylene carbonate, N-methyl pyrrolidone and gamma butyrolactone.

29. The method of claim 26 wherein said solvent is propylene carbonate.

* * * * *

UNITED STATES PATENT AND TRADEMARK OFFICE
CERTIFICATE OF CORRECTION

| | | |
|---|---|---|
| PATENT NO. | : 6,200,891 B1 | Page 1 of 1 |
| DATED | : March 13, 2001 | |
| INVENTOR(S) | : Rangarajan Jagannathan et al. | |

It is certified that error appears in the above-identified patent and that said Letters Patent is hereby corrected as shown below:

<u>Column 5,</u>
Line 65, change "cyclopentanon" to -- cyclopentanone --.

<u>Column 7,</u>
Line 11, change "seslected" to -- selected --.

Signed and Sealed this

Fifth Day of March, 2002

Attest:

JAMES E. ROGAN
*Attesting Officer*   *Director of the United States Patent and Trademark Office*